(12) United States Patent
Hsu

(10) Patent No.: US 7,259,076 B2
(45) Date of Patent: *Aug. 21, 2007

(54) HIGH-DENSITY SOI CROSS-POINT MEMORY FABRICATING METHOD

(75) Inventor: Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 136 days.

This patent is subject to a terminal disclaimer.

(21) Appl. No.: 11/216,680

(22) Filed: Aug. 31, 2005

(65) Prior Publication Data

US 2006/0035451 A1    Feb. 16, 2006

Related U.S. Application Data

(63) Continuation of application No. 10/441,378, filed on May 20, 2003, now Pat. No. 7,001,846.

(51) Int. Cl.
*H01L 21/331* (2006.01)
*H01L 21/8222* (2006.01)

(52) U.S. Cl. .................. 438/311; 438/680; 438/692; 438/381; 438/706; 257/E21.17; 257/E21.053; 257/E21.058; 257/E21.245; 257/E21.304; 257/E21.646

(58) Field of Classification Search ............... 438/311, 438/238, 381, 680, 681, 691, 692, 638, 685, 438/686, 706, 733
See application file for complete search history.

(56) References Cited

U.S. PATENT DOCUMENTS

| | | | | |
|---|---|---|---|---|
| 6,784,066 B2 * | 8/2004 | Hachisuka | .................. | 438/383 |
| 6,797,557 B2 * | 9/2004 | Chiang | ..................... | 438/239 |
| 6,809,402 B1 * | 10/2004 | Hopper et al. | ............. | 257/647 |
| 6,859,382 B2 * | 2/2005 | Rinerson et al. | ............ | 365/148 |
| 7,001,846 B2 * | 2/2006 | Hsu | ........................... | 438/706 |

* cited by examiner

*Primary Examiner*—David Nhu
(74) *Attorney, Agent, or Firm*—Law Office of Gerald Maliszewski; Gerald Maliszewski (57) ABSTRACT

A method for fabricating a high-density silicon-on-insulator (SOI) cross-point memory array and an array structure are provided. The method includes the following steps: selectively forming a hard mask on an SOI substrate, defining memory areas, active device areas, and top electrode areas; etching to remove the exposed silicon (Si) surfaces; selectively forming metal sidewalls adjacent the hard mask; filling the memory areas with memory resistor material; removing the hard mask, exposing the underlying Si active device areas; forming an overlying layer of oxide; etching the oxide to form contact holes to the active device areas; forming diodes in the contact holes; and, forming bottom electrode lines overlying the diodes.

22 Claims, 7 Drawing Sheets

Fig. 1
(PENDING ART)

Fig. 9 AFTER OXIDE DEPOSITION AND CMP

HIGH-DENSITY SOI CROSS-POINT MEMORY FABRICATING METHOD

RELATED APPLICATIONS

This application is a Continuation of a patent application entitled, HIGH-DENSITY SOI CROSS-POINT MEMORY ARRAY AND METHOD FOR FABRICATING SAME, invented by Sheng Teng Hsu, Ser. No. 10/441,378, filed May 20, 2003, now U.S. Pat. No. 7,001,846, which is incorporated herein by reference.

BACKGROUND OF THE INVENTION

1. Field of the Invention

This invention generally relates to integrated circuit (IC) memory fabrication and, more particularly, to a high-density resistor random access memory (RRAM) array structure and fabrication process.

2. Description of the Related Art

Conventionally, RRAMs are fabricated on bulk silicon. As is well known in the art, there is a relatively high degree and leakage current and capacitance associated with memory cells fabricated on bulk silicon, that translates into degraded read and write times. However, applications are beginning to demand that RRAM programming pulse widths be as narrow as 10 nanoseconds (ns). Silicon-on-insulator (SOI) CMOS devices are known to have a significantly higher speed than corresponding bulk silicon devices. Therefore, a SOI substrate RRAM would be desirable for very high-speed memory circuits.

An SOI substrate is made from a silicon (Si) layer that overlies an insulator material, such as sapphire or oxide. The insulation layer of an SOI substrate completely isolates associated NMOS and PMOS transistors, to prevent the occurrence of latch-up. Further, the device channel doping need not overcompensate, and the diffusion regions do not have bottom junctions. All these factor lead to a reduction in parasitic capacitance.

In a pending application entitled, DUAL-TRENCH ISOLATED CROSSPOINT MEMORY ARRAY AND METHOD FOR FABRICATING SAME, invented by Hsu et al., Ser. No. 10/350,643, filed Jan. 23, 2003, and which is incorporated herein by reference, a vertical one resistor/one diode (1R1D) structure is described that can be used to form a high density memory array. The structure forms P+ on a highly conductive buried N+ bit line. The resulting thickness of the P+N junction, however, is at least 500 nanometers (nm), and not suitable for SOI processes.

Figure 1:
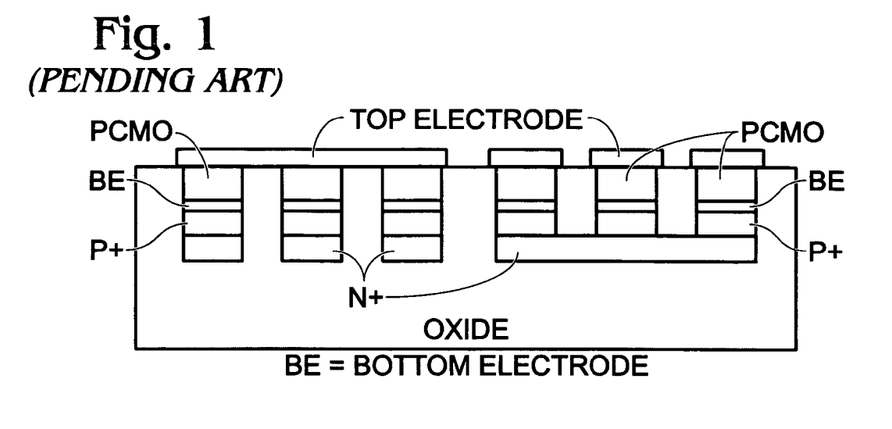
FIG. 1 is a partial cross-sectional view of a dual trench isolated 1R1D RAM on bulk silicon wafer (pending art).

FIG. 1 is a partial cross-sectional view of a dual trench isolated 1R1D RAM on bulk silicon wafer (pending art). A shallow trench extends, at least partially, into the P+ layer to avoid the leakage current drawn from the bottom electrode, to the N+ bit line. The conductivity of the N+ bit line is no higher than 1 kilo-ohm (Kohm) per square if the thickness is less than 500 nm. Therefore, the minimum thickness of the SOI film has to be in the order of 500 nm in order to provide low parasitic resistance. However, the thickness of a periphery circuit area can be much thinner than that of the memory area, and this thickness difference is too large for a state-of-the-art lithograph tool to handle.

It would he advantageous it a process were developed to increase the density of memory cells formed in an SOI RRAM array.

It would be advantageous if an SOI RRAM array could be formed to take advantage of the minimum available feature size.

SUMMARY OF THE INVENTION

The present invention describes a high-density, high-speed cross-point resistor memory array ultra-large-scale integration (ULSI) memory chip and embedded memory application. The invention takes advantage of SOI device characteristics to form memory cells having a size that is limited only the feature scale.

Accordingly, a method is provided for fabricating a high-density SOI cross-point memory array. The method comprises: selectively forming a hard mask on an SOI substrate, defining memory areas, active device areas, and top electrode areas; etching to remove the exposed silicon (Si) surfaces; selectively forming metal sidewalls adjacent the hard mask; filling the memory areas with memory resistor material; removing the hard mask, exposing the underlying Si active device areas; forming an overlying layer of oxide; etching the oxide to form contact holes to the active device areas; forming diodes in the contact holes; and, forming bottom electrode lines overlying the diodes.

In some aspects of the method, selectively forming metal sidewalls adjacent the hard mask includes: isotropically depositing the metal; anisotropically etching the metal to form the sidewalls with a sidewall width in the range of 25 to 50 nm, between memory areas and active device areas. Top electrode lines are also formed by this process. In other aspects, selectively forming metal sidewalls adjacent the hard mask includes: forming an electrode layer, from a material such as Ir, Pt, Au, or Ru, adjacent the hard mask; forming a barrier layer, from a material such as Ti, TiN, WN, or TaN, adjacent the electrode layer, interposing the electrode layer between the barrier layer and the hard mask.

Additional details of the above-described method, and a high-density SOI cross-point memory array are described below.

DETAILED DESCRIPTION OF THE PREFERRED EMBODIMENTS

Figure 2:
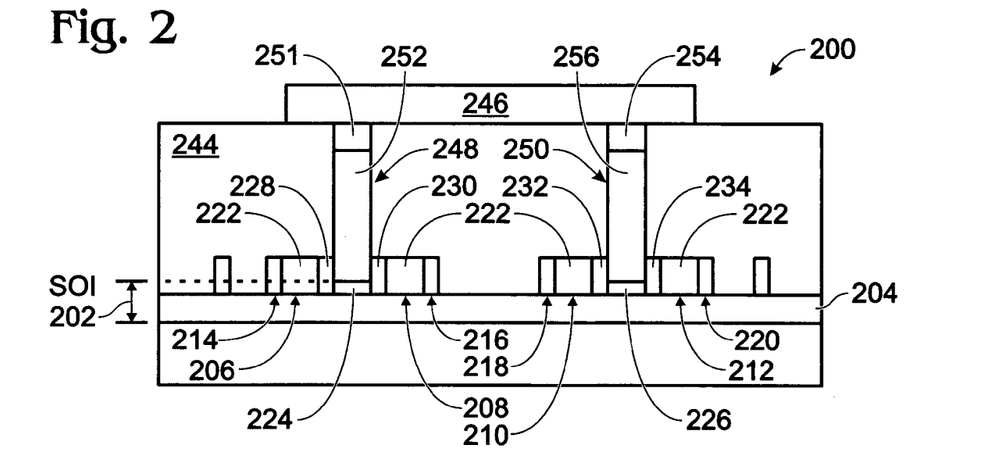
FIG. 2 is a partial cross-sectional view of the present invention high-density SOI cross-point memory array.

FIG. 2 is a partial cross-sectional view of the present invention high-density SOI cross-point memory array. The array 200 comprises a SOI substrate 202, including an insulator layer 204. As shown, most of the Si of the shown SOI substrate 202 has been etched away. Memory etched areas and top electrode etched areas are formed in the SOI substrate 202 (below the dotted line), extending to the insulator layer 204. Memory resistor material 222 overlies the memory etched areas to form memory areas 206/208/210/212. The memory resistor material 222 can be a material such as $Pr_{0.3}Ca_{0.7}MnO_3$ (PCMO), colossal magnetoresistance (CMR), or a high temperature superconductivity (HTSC) material.

SOI top layer Si active device area 224 is adjacent memory areas 206 and 208, and active device area 226 is adjacent memory areas 210 and 212. Metal sidewall perimeter 228 is between the memory area 206 and active device area 224. Metal sidewall perimeter 230 is between the memory area 208 and active device area 224. Metal sidewall perimeter 232 is between the memory area 210 and active device area 226. Metal sidewall perimeter 234 is between the memory area 212 and active device area 226. Also shown are metal sidewall top electrode lines 214, 216, 218, and 220.

An oxide passivation layer 244 overlies the memory areas 206/208/210/212 and top electrode lines 214/216/218/220. Bottom electrode lines overlie the oxide passivation layer 244. Bottom electrode line 246 is shown. A diode 248 is connected between the bottom electrode line 246 and the metal sidewall perimeters 228 and 230. Diode 250 is connected between the bottom electrode line 246 and the metal sidewall perimeters 232 and 234.

Figure 3:
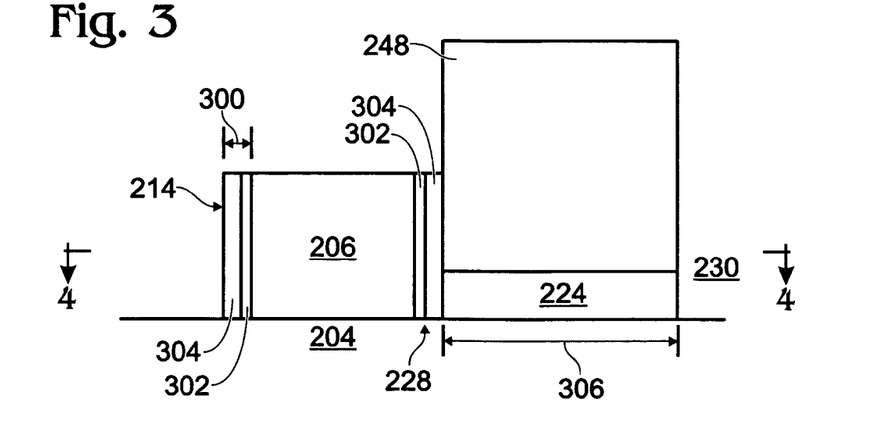
FIG. 3 is a partial cross-sectional detailed view of memory area, which is representative of the other memory areas.

FIG. 3 is a partial cross-sectional detailed view of memory area 206, which is representative of the other memory areas. In some aspects, as represented by top electrode 214, the metal sidewall perimeters (228/230/232/234, see FIG. 2) and metal sidewall top electrode lines (214/216/218/220) have a width 300 in the range of 25 to 50 nanometers.

In other aspects, the metal sidewall perimeters and metal sidewall top electrode lines, as represented by top electrode line 214, include a barrier layer 302 and an electrode layer 304. The barrier layer 302 horizontally overlies the electrode layer 304. Alternately stated, the barrier layer 302 is interposed between the electrode layer 304 and the memory area 206. Typically, the electrode layer 304 is formed adjacent a hard mask (as explained in detail below) and the barrier layer 302 is formed thereafter. The barrier layer 302 can be a material such as Ti, TiN, WN, or TaN. The electrode layer 304 can be a metal such as Ir, Pt, Au, or Ru. Note that metal sidewall perimeter 228 can also be formed from a barrier layer 302 interposed between the electrode layer 304 and the memory area 206.

The active device areas, as represented by active device area 224, have a $1F^2$ geometry. As shown, the active device area 224 has a width 306 equal to F, where F is the minimum feature size. The active device area 224 also has a length of F, extending "into the sheet" which cannot be seen in this figure. Likewise, the diodes, as represented by diode 248, have a $1F^2$ geometry and connect with metal sidewall perimeters. Diode 248 is shown connected to sidewall perimeter 228 and 230. Diode 248 is operatively connected to memory area 206 through metal sidewall perimeter 228, and operatively connected to memory area 208 through metal sidewall perimeter 230. As used herein, "operatively connected" means indirectly connected or connected through an intervening element.

Figure 4:
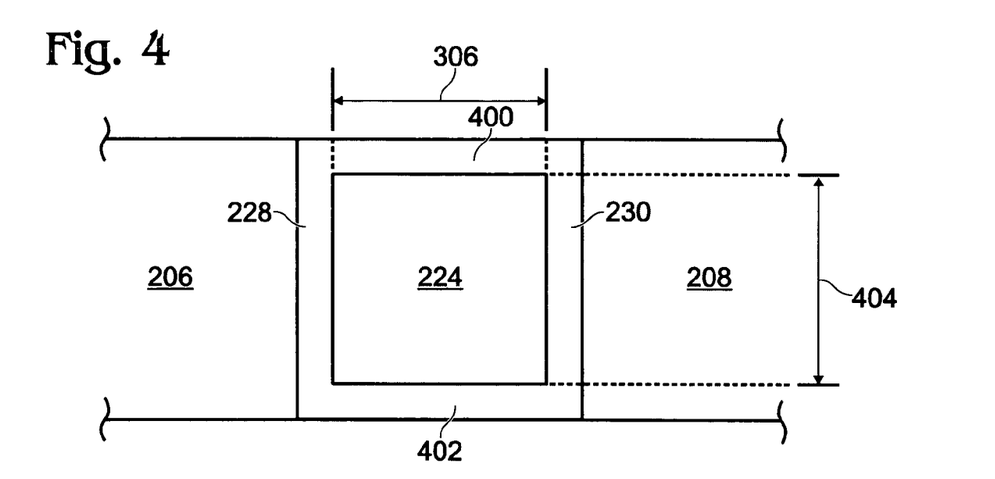
FIG. 4 is a plan view of the active device area of FIG. 3.

FIG. 4 is a plan view of the active device area 224 of FIG. 3. This drawing shows that each active device area, as represented by active device area 224, is surrounded by metal sidewall perimeters. Shown are metal sidewall perimeters 228, 230, 400, and 402. As explained in the fabrication process below, the four perimeters are actually formed as a single element. The active device area 224 is formed into $1F^2$ geometry squares, where length 404 is equal to width 306. The memory areas, or memory cell areas, such as memory area 206, can be formed into $4F^2$ geometry squares.

Returning to FIG. 2, each diode includes a P++/N+ junction. Diode 248 includes P++ region 251 and N+ region 252. Likewise, diode 250 includes P++ region 254 and N+ region 256. Then, the bottom electrode line 246 is a word lines and the top electrode lines 214/216/218/220 are bit lines. Alternatively the bottom electrode line 246 is a bit lines and the top electrode lines 214/216/218/220 are word lines. Alternately but not shown, each diode could be formed with an N++/P+ junction.

Figure 5:
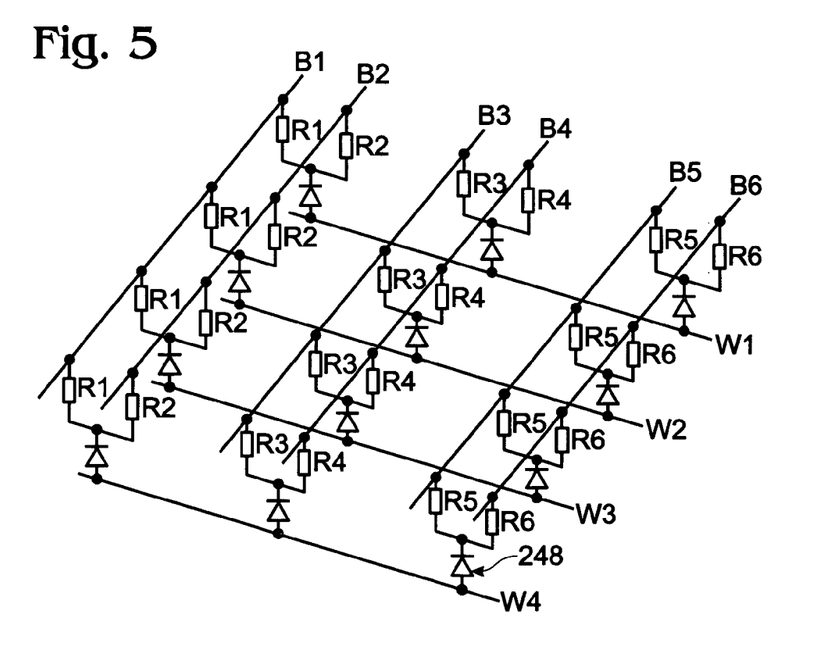
FIG. 5 is a schematic representation of the present invention array structure.

FIG. 5 is a schematic representation of the present invention array structure. Although a 6 bit (B) by 4 word (W) array is specifically shown, in other aspects, the word and bit lines can be exchanged. The designation of lines as either word or bit lines in dependent upon the voltage polarities applied to the finished device in operation. Considering both FIGS. 2 and 5, each diode is connected between a bottom electrode line and a plurality of memory areas. More specifically, each diode is connected to the metal sidewall perimeters of a pair of adjacent memory areas. For example, diode 248 is to adjacent memory areas 206 (R5) and 208 (R6).

Functional Description

A cross-sectional view of the present invention SOI 1R1D RRAM structure is shown in FIG. 2. Shown is a common word line configuration, however, a common bit line configuration is equally practical. The bit lines are formed with a sidewall metal line overlying the SOI insulator. The bit line also serves as the top electrode of the RRAM memory cell. The top electrode of the memory resistor is also a sidewall metal line on insulator. Two adjacent resistor memory cells are connected to a SOI P+ layer, which in turn, is connected to the word line through a shallow N+ junction. The cell size can be as small as $4F^2$.

Figure 6:
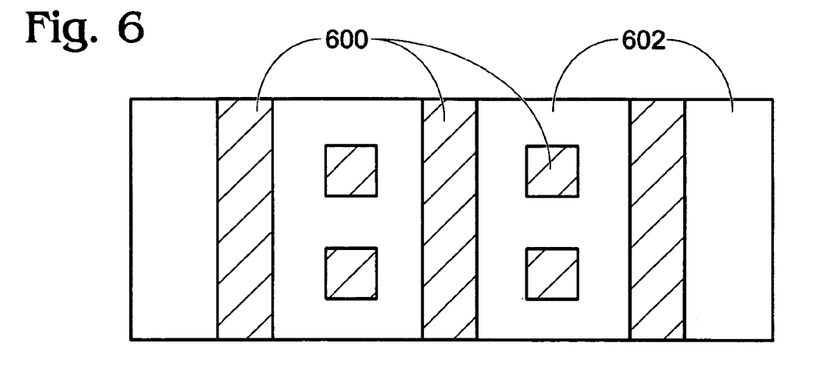
FIG. 6 is a plan view of the SOI substrate initial etching step.

FIG. 6 is a plan view of the SOI substrate initial etching step. A layer of hard mask 600, of either silicon nitride or polysilicon, is deposited onto a SOI wafer 602. The thickness of the SOI film is not critical. Photoresist is used to etch the hard mask and the SOI film, as shown.

Figure 7:
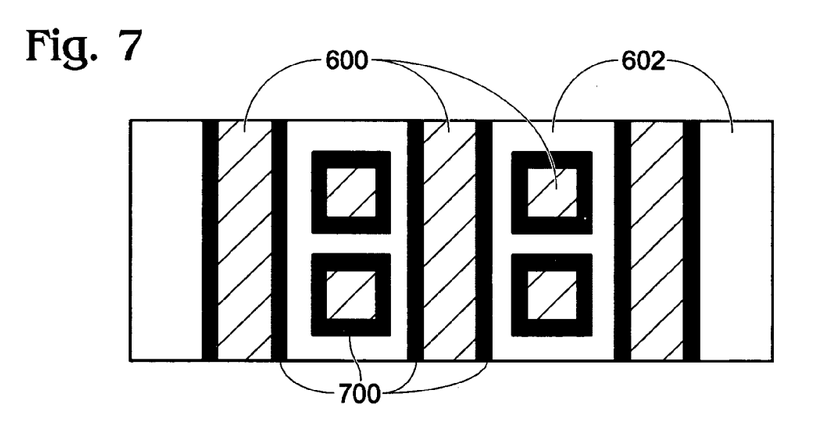
FIG. 7 is a plan view following the formation of the top electrodes and perimeter sidewalls.

FIG. 7 is a plan view following the formation of the top electrodes and perimeter sidewalls 700. RRAM metal electrode material is deposited onto the film and anisotropically (plasma) etched. In some aspects, a barrier, such as Ti, TiN, WN, or TaN, layer is required. The electrode metal can be Pt or Ir, for example.

Figure 8:
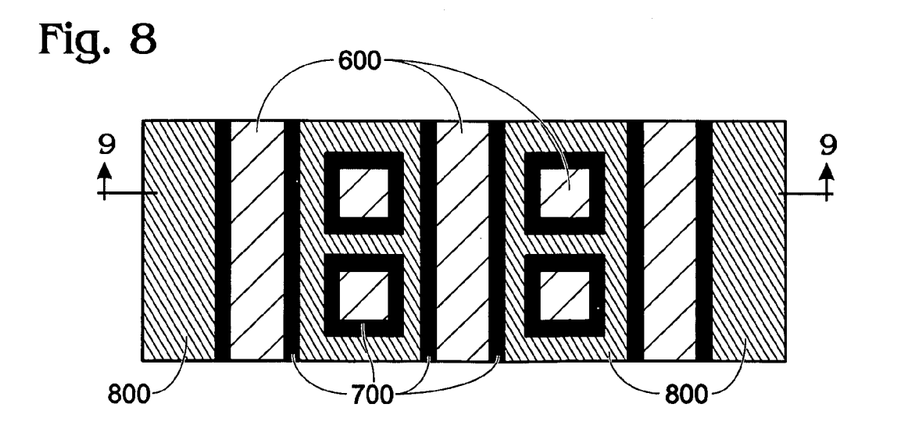
FIG. 8 is a plan view following an oxide deposition process.

FIG. 8 is a plan view following an oxide deposition process. A layer of oxide 800, at least 1.5 times thicker than the sum of the thickness of the SOI film and the hard mask 600, is deposited. After deposition, the oxide is planarized by a CMP process.

Figure 9:
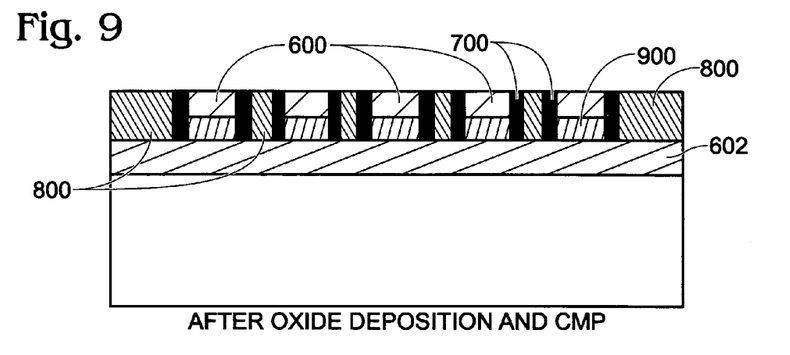
FIG. 9 is a partial cross-sectional view of FIG. 8.

FIG. 9 is a partial cross-sectional view of FIG. 8. This view shows the Si layer 900 of the SOI substrate that has been protected by the overlying hardmask 600.

Figure 10:
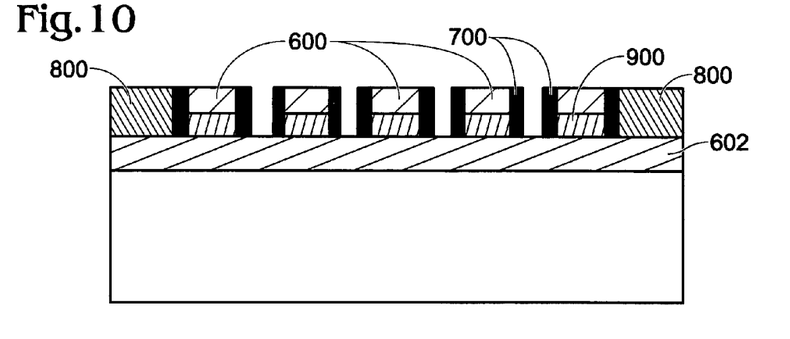
FIG. 10 is the cross-section view of FIG. 9 following the removal of the oxide in selected (memory) areas.

FIG. 10 is the cross-section view of FIG. 9 following the removal of the oxide in selected (memory) areas. Photoresist is used as mask.

Figure 11:
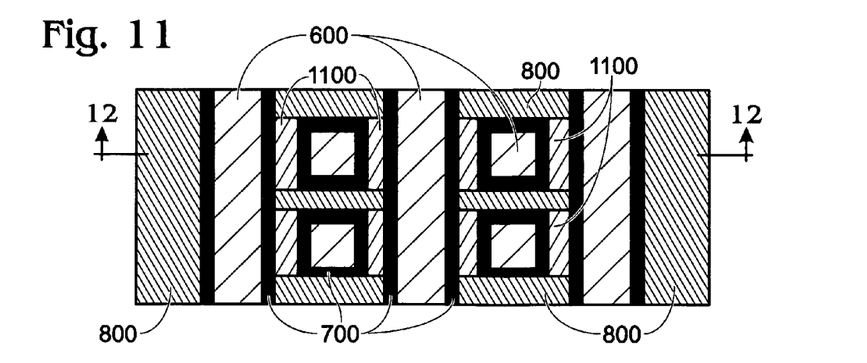
FIG. 11 is a plan view of the array of FIG. 10 following the deposition of memory resistor material.

FIG. 11 is a plan view of the array of FIG. 10 following the deposition of memory resistor material 1100. The memory resistor material can be deposited by spin coating, sputtering, or a MOCVD process.

Figure 12:
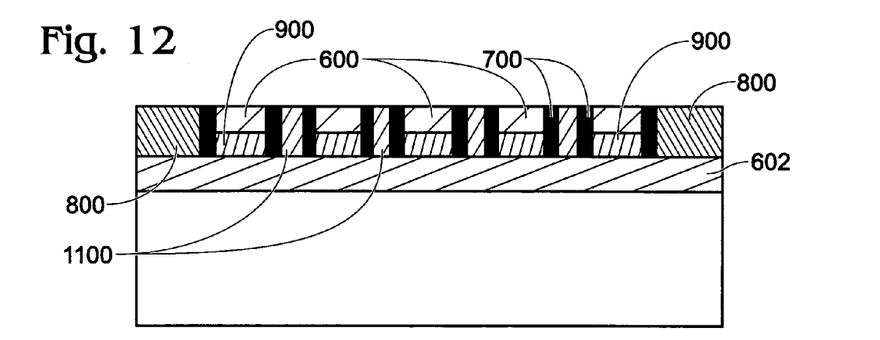
FIG. 12 is a partial cross-sectional view of FIG. 11, following a memory resistor material CMP process.

FIG. 12 is a partial cross-sectional view of FIG. 11, following a memory resistor material CMP process.

Figure 13:
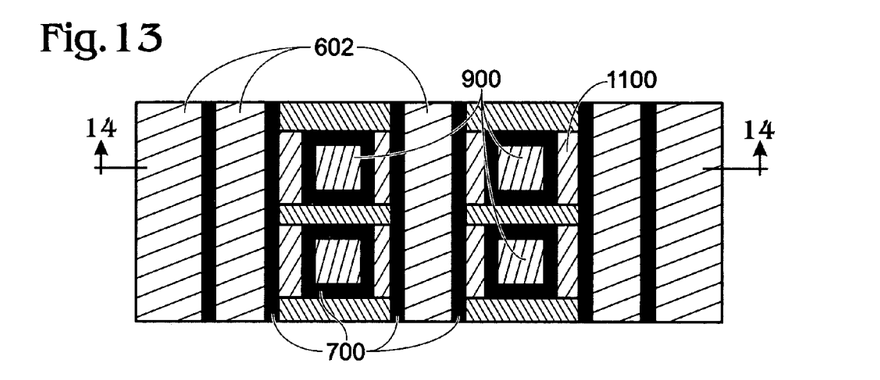
FIG. 13 is a plan view of FIG. 12, following the removal of the hardmask.

FIG. 13 is a plan view of FIG. 12, following the removal of the hardmask. The hardmask is removed by any state-of-the-art process, such as a wet etch to remove a nitride hardmask, or a dry etch to remove a polysilicon hardmask. A photoresist mask is used to remove SOI silicon 900 along the bit lines.

Figure 14:
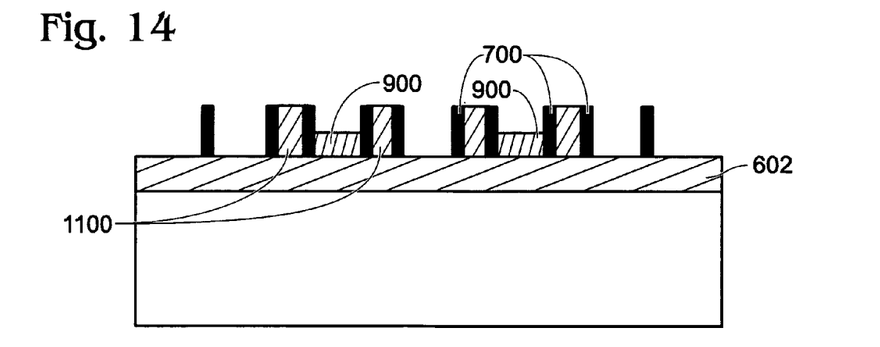
FIG. 14 is a partial cross-sectional view of FIG. 13.

FIG. 14 is a partial cross-sectional view of FIG. 13.

Figure 15:
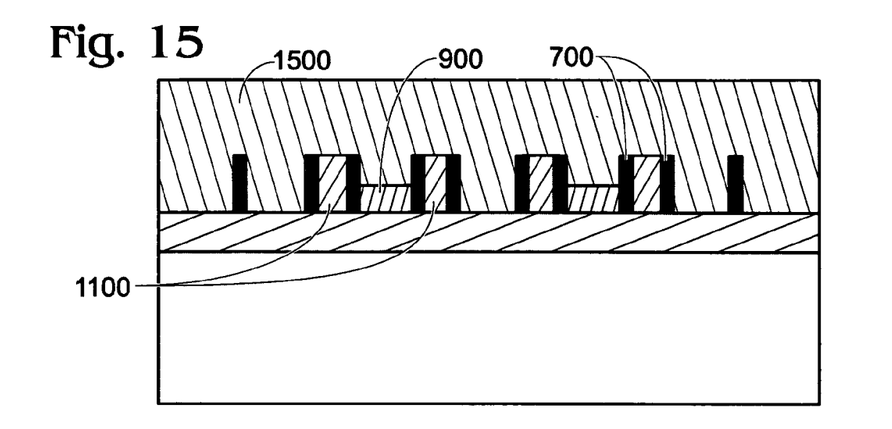
FIG. 15 is a partial cross-sectional view following an oxide deposition step.

FIG. 15 is a partial cross-sectional view following an oxide deposition step. A layer of passivation silicon oxide 1500 is deposited and a CMP process performed.

Figure 16:
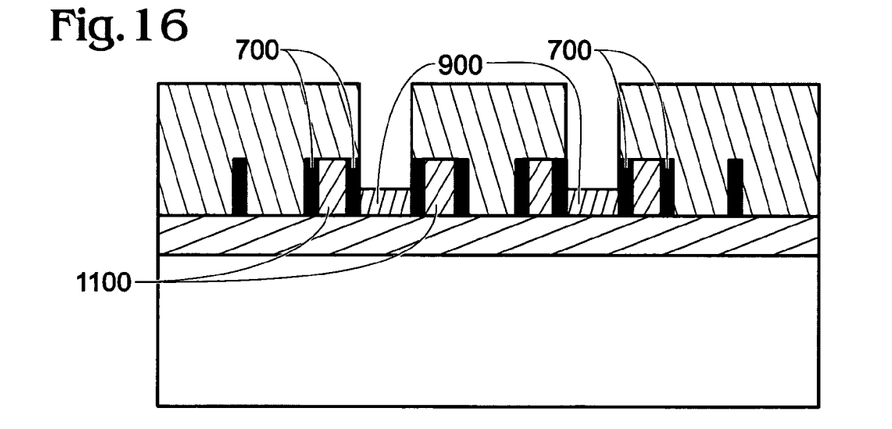
FIG. 16 is a partial cross-sectional view following a contact hole etching process.

FIG. 16 is a partial cross-sectional view following a contact hole etching process. The bit contact is located at the center of the square as is shown. For minimum geometry layout this square is $1F^2$. As a result, the bit contact holes overlaps the metal perimeters 700.

Figure 17:
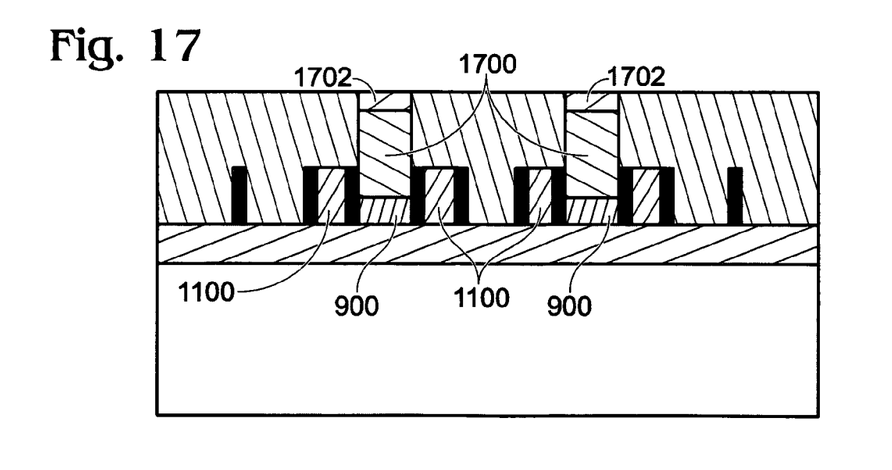
FIG. 17 is a partial cross-sectional view after the formation of diodes.

FIG. 17 is a partial cross-sectional view after the formation of diodes. After the bit contact hole is opened, a layer of silicon is epitaxially (selectively) grown in the bit contact holes, followed by deep N+ implant 1700 and a shallow P++ implant 1702, to form a P++/N+ junction. The P++/N+ depletion region does not touch metal sidewall perimters. Alternately, the selective epitaxial grow process may be replaced with polysilicon deposition and a SPE process. The SPE (Solid Phase Epitaxial) growth process includes an annealing process at temperature 450° C. to 600° C. for 30 minutes to 2 hours. The polysilicon is then etched, or CMP planarized, followed by deep N+ and shallow P++ ion implantation.

An interconnet metal is then deposited and the structure of FIG. 2 results. Although the bottom electrode has been described as a word line, and the sidewall top electrodes as bit line, the bottom and top electrodes can be bit lines or word lines, respectively, in other aspects of the invention. In either case, it is preferred also to arrange the polarity of the N++/P+ junction to P++/N+ junction for positive voltage operation.

Figure 18:
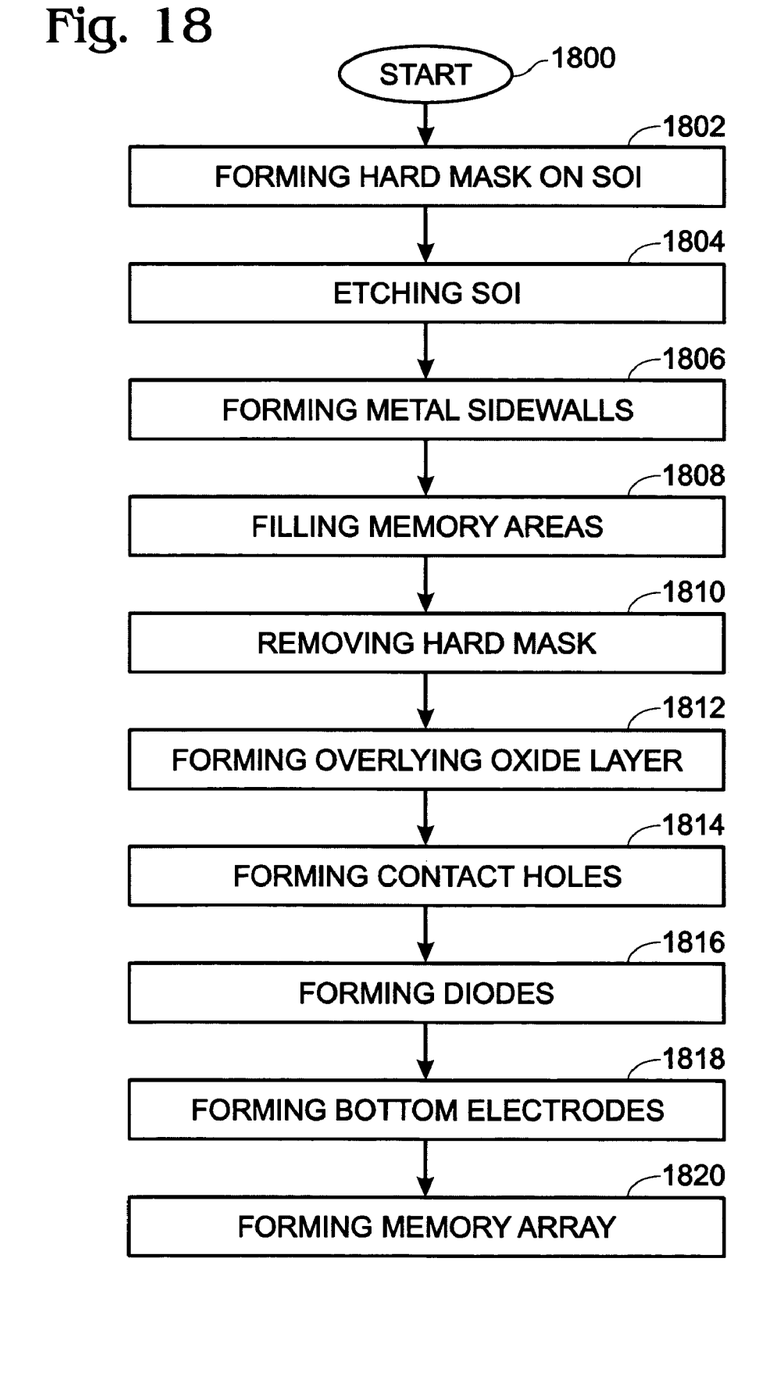
FIG. 18 is a flowchart illustrating the present invention method for fabricating a high-density SOI cross-point memory array.

FIG. 18 is a flowchart illustrating the present invention method for fabricating a high-density SOI cross-point memory array. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1800.

Step 1802 selectively forms a hard mask on an SOI substrate, defining memory areas, active device areas, and top electrode lines. Step 1804 etches to remove the exposed silicon (Si) surfaces. Step 1806 selectively forms metal sidewalls adjacent the hard mask. Step 1808 fills the memory areas with memory resistor material. Step 1810 removes the hard mask, exposing the underlying Si active device areas. Step 1812 forms an overlying layer of oxide. Step 1814 etches the oxide to form contact holes to the active device areas. Step 1816 forms diodes in the contact holes. Step 1818 forms bottom electrode lines overlying the diodes. Step 1820 forms a bottom electrode/top electrode memory array.

In some aspects of the method, selectively forming a hard mask on an SOI substrate in Step 1802 includes forming a hard mask from a material such as nitride and polysilicon.

In other aspects, selectively forming metal sidewalls adjacent the hard mask in Step 1806 includes substeps (not shown). Step 1806a isotropically deposits the metal. Step 1806b anisotropically etches the metal to form the sidewalls between memory areas and active device areas, as well as top electrode lines. In some aspects, Step 1806b uses a plasma etch process.

In one aspect, isotropically depositing the metal in Step 1806a includes isotropically depositing a metal thickness in the range of 50 to 100 nanometers (nm). Anisotropically etching the metal in Step 1806b includes forming metal sidewalls and top electrode lines having a sidewall width in the range of 25 to 50 nm.

In other aspects, selectively forming metal sidewalls adjacent the hard mask in Step 1806 includes alternate substeps (not shown). Step 1806c forms an electrode layer adjacent the hard mask. Step 1806d forms a barrier layer horizontally overlying the electrode layer. Alternately stated, Step 1806d interposes the electrode layer between the barrier layer and the hard mask. In some aspects, Step 1806c forms a barrier layer from a metal such as Ti, TiN, WN, or TaN. Step 1806d may include forming an electrode layer from a metal such as Ir, Pt, Au, or Ru.

In some aspects, filling the memory areas with memory resistor material in Step 1808 includes substeps (not shown). Step 1808a isotropically deposits a layer of oxide. Step 1808b CMP planarizes the oxide to the level of the hard mask. Step 1808c etches the oxide from the memory area. Step 1808d isotropically deposits memory resistor material. Step 1808e CMP planarizes the memory resistor material to the level of the hard mask. Step 1808d may include isotropically depositing memory resistor material by a process such as spin coating, sputtering, or a metal organic chemical vapor deposition (MOCVD) processes. In some aspects, Step 1808 fills the memory areas with memory resistor material such as PCMO, colossal magnetoresistance (CMR), or a high temperature superconductivity (HTSC) material.

In some aspects, removing the hard mask in Step 1810 includes substeps (not shown). Step 1810a etches to remove all the hard mask, exposing the underlying Si. Step 1810b photoresist masks the Si active device areas. Step 1810c etches to remove the exposed Si between adjacent top electrode lines.

In some aspects, selectively forming a hard mask on an SOI substrate in Step 1802 includes forming $1F^2$ geometry active device areas. Likewise, etching the oxide to form contact holes to the active device areas in Step 1814 includes substeps (not shown). Step 1814a centers the contact holes overlying the center of the active device areas. Step 1814b forms the contact holes using $1F^2$ geometry etching techniques. Step 1814c, in response to forming the contact holes, exposes the metal sidewalls adjacent the active device areas.

Forming diodes in the contact holes in Step 1816 typically includes forming a diode between a bottom electrode line and a memory area in a series of substeps (not shown). Step 1816a epitaxially grows Si in the contact holes. Step 1816b performs a deep N+ implant. Step 1816c performs a shallow P++ implant. Step 1816d, in response to the implants, forms a P++/N+ junction in the Si between a bottom electrode word line and a metal electrode sidewall adjacent a memory area. Alternately, Step 1816b performs a deep P+ implant and Step 1816c performs a shallow N++ implant. Then, Step 1816d forms a N++/P+ junction in the Si between a bottom electrode bit line and a metal electrode sidewall adjacent a memory area.

In another aspect, different substeps (not shown) can be performed. Step 1816e isotropically deposits polysilicon. Step 1816f performs a solid phase epitaxial growth process. Step 1816g CMP planarizes the Si to the level of the oxide. Step 1816h performs a deep N+ implant. Step 1816i performs a shallow P++ implant. Step 1816j, in response to the implants, forms a P++/N+ junction in the Si between a bottom electrode word line and a metal electrode sidewall adjacent a memory area. Alternately, Step 1816h performs a deep P+ implant and Step 1816i performs a shallow N++ implant. Then, Step 1816j forms a N++/P+ junction in the Si between a bottom electrode bit line and a metal electrode sidewall adjacent a memory area.

In other aspects, forming a diode between the bottom electrode line and the active device areas in Step 1816 includes forming a diode between a bottom electrode line and a plurality of memory areas, through a single intervening diode. In one example, a diode is connected to the metal sidewall perimeters of a pair of adjacent memory areas.

A high-density SOI cross-point array and fabrication process has been presented. Examples have been used to illustrate some principles of the structure. Likewise, example processes have been used to describe fabrication. However, the invention is not limited to merely these examples. Other variations and embodiments of the invention will occur to those skilled in the art.

I claim:

1. A method for fabricating a high-density silicon-on-insulator (SOI) cross-point memory array, the method comprising:
    selectively forming a hard mask on an SOI substrate, defining memory areas, silicon (Si) active device areas, and top electrode areas;
    etching to remove exposed Si surfaces;
    selectively forming metal sidewalls adjacent the hard mask;
    filling the memory areas with memory resistor material;
    removing the hard mask, exposing the underlying Si active device areas;
    forming an overlying layer of oxide;
    etching the oxide to form contact holes to the Si active device areas;
    forming diodes in the contact holes; and,
    forming bottom electrode lines overlying the diodes.

2. The method of claim 1 wherein selectively forming a hard mask on an SOI substrate includes forming a hard mask from a material selected from the group including nitride and polysilicon.

3. The method of claim 1 wherein selectively forming metal sidewalls adjacent the hard mask includes:
    isotropically depositing a metal;
    anisotropically etching the metal to form the sidewalls between memory areas and Si active device areas, as well as bottom electrode lines.

4. The method of claim 3 wherein isotropically depositing the metal includes isotropically depositing a metal thickness in the range of 50 to 100 nanometers (nm); and,
    wherein anisotropically etching the metal includes forming metal sidewalls and bottom electrode lines having a sidewall width in the range of 25 to 50 nm.

5. The method of claim 3 wherein etching the metal includes using a plasma etch process.

6. The method of claim 1 wherein selectively forming metal sidewalls adjacent the hard mask includes:
    forming an electrode layer adjacent the hard mask; and,
    interposing the electrode layer between a barrier layer and the hard mask.

7. The method of claim 6 wherein forming a barrier layer includes forming a barrier layer from a metal selected from the group including Ti, TiN, WN, and TaN.

8. The method of claim 6 wherein forming an electrode layer includes forming an electrode layer from a metal selected from the group including Ir, Pt, Au, and Ru.

9. The method of claim 1 wherein filling the memory areas with memory resistor material includes:
    isotropically depositing a layer of oxide; and,
    chemical mechanically polish (CMP) planarizing the oxide to the level of the hard mask;
    etching the oxide from the memory area;
    isotropically depositing memory resistor material; and,
    CMP planarizing the memory resistor material to the level of the hard mask.

10. The method of claim 9 wherein isotropically depositing memory resistor material includes depositing memory resistor material by a process selected from the group including spin coating, sputtering, and metal organic chemical vapor deposition (MOCVD) processes.

11. The method of claim 1 wherein filling the memory areas with memory resistor material includes using a memory resistor material selected from the group including PCMO, colossal magnetoresistance (CMR), and a high temperature superconductivity (HTSC) material.

12. The method of claim 1 wherein removing the hard mask includes:
    etching to remove all the hard mask, exposing the underlying Si;
    photoresist masking the Si active device areas;
    etching to remove the exposed Si between adjacent top electrode lines.

13. The method of claim 1 wherein selectively forming a hard mask on an SOI substrate includes forming $1F^2$ geometry active device areas; and,
    wherein etching the oxide to form contact holes to the Si active device areas includes:
    centering the contact holes overlying the center of the Si active device areas;
    forming the contact holes using $1F^2$ geometry etching techniques; and,
    in response to forming the contact holes, exposing the metal sidewalls adjacent the Si active device areas.

14. The method of claim 1 wherein forming diodes in the contact holes includes, forming a diode between a bottom electrode line and a memory area.

15. The method of claim 14 wherein forming a diode between the bottom electrode line and a memory area includes:
    epitaxially growing Si in the contact holes;
    performing a deep N+ implant;
    performing a shallow P++ implant; and,
    in response to the implants, forming a P++/N+ junction in the Si between a bottom electrode word line and a metal electrode sidewall adjacent a memory area.

16. The method of claim 14 wherein forming a diode between the bottom electrode line and a memory area includes:

isotropically depositing polysilicon;
  performing a solid phase epitaxial growth process;
  CMP planarizing the Si to the level of the oxide;
  performing a deep N+ implant;
  performing a shallow P++ implant; and,
  in response to the implants, forming a P++/N+ junction in the Si between a bottom electrode word line and a metal electrode sidewall adjacent a memory area.

17. The method of claim 14 wherein forming a diode between the bottom electrode line and a memory area includes:

epitaxially growing Si in the contact holes;
  performing a deep P+ implant;
  performing a shallow N++ implant; and,
  in response to the implants, forming a N++/P+ junction in the Si between a bottom electrode bit line and a metal electrode sidewall adjacent a memory area.

18. The method of claim 14 wherein forming a diode between the bottom electrode line and a memory area includes:

isotropically depositing polysilicon;
  performing a solid phase epitaxial growth process;
  CMP planarizing the Si to the level of the oxide;
  performing a deep P+ implant;
  performing a shallow N++ implant; and,
  in response to the implants, forming a N++/P+ junction in the Si between a bottom electrode bit Line and a metal electrode sidewall adjacent a memory area.

19. The method of claim 14 wherein forming a diode between the bottom electrode line and the active device areas includes forming a diode between a bottom electrode line and a plurality of memory areas, through a single intervening diode.

20. The method of claim 19 wherein forming a diode between a bottom electrode line and a plurality of memory areas, through a single intervening diode includes forming a diode connected to the metal sidewall perimeters of a pair of adjacent memory areas.

21. The method of claim 20 further comprising:

forming a bottom electrode/top electrode memory array.

22. The method of claim 20 wherein the pair of adjacent memory areas form a unit memory in a cross-point memory array.

\* \* \* \* \*